(12) United States Patent
Kim

(10) Patent No.: US 6,509,793 B2
(45) Date of Patent: Jan. 21, 2003

(54) SWITCHING AMPLIFIER RESOLUTION ENHANCEMENT APPARATUS AND METHODS

(76) Inventor: Larry Kim, 7518 Valleybrook, West Bloomfield, MI (US) 48322

( * ) Notice: Subject to any disclaimer, the term of this patent is extended or adjusted under 35 U.S.C. 154(b) by 52 days.

(21) Appl. No.: 09/862,760

(22) Filed: May 21, 2001

(65) Prior Publication Data

US 2001/0043117 A1 Nov. 22, 2001

Related U.S. Application Data

(60) Provisional application No. 60/205,724, filed on May 19, 2000.

(51) Int. Cl.[7] ............................. H03F 3/38; H03F 21/00; H03F 3/217
(52) U.S. Cl. ...................... 330/10; 330/207 A; 330/251
(58) Field of Search ............................... 330/10, 207 A, 330/251

(56) References Cited

U.S. PATENT DOCUMENTS

| | | | | |
|---|---|---|---|---|
| 4,403,196 A | | 9/1983 | Grandmont ................... | 330/10 |
| 4,403,197 A | * | 9/1983 | Swanson ...................... | 330/10 |
| 4,471,314 A | | 9/1984 | Lindberg ..................... | 330/10 |
| 4,773,096 A | | 9/1988 | Kirn .......................... | 381/120 |
| 5,398,003 A | | 3/1995 | Heyl et al. .................. | 330/10 |
| 5,422,597 A | * | 6/1995 | Stengel et al. ............... | 330/10 |
| 5,442,317 A | * | 8/1995 | Stengel ...................... | 330/10 |
| 5,610,553 A | | 3/1997 | Kirn .......................... | 330/10 |
| 5,613,010 A | | 3/1997 | Heyl et al. .................. | 381/117 |
| 5,886,572 A | | 3/1999 | Myers et al. ................. | 330/10 |
| 5,909,153 A | | 6/1999 | Delano et al. ................ | 332/107 |
| 5,949,282 A | | 9/1999 | Nguyen et al. ................ | 330/10 |
| 5,982,231 A | | 11/1999 | Nalbant ...................... | 330/10 |
| 6,014,055 A | * | 1/2000 | Chester ...................... | 330/10 |
| 6,150,880 A | | 11/2000 | Schweighofer ................. | 330/207 A |
| 6,229,388 B1 | | 5/2001 | Nalbant ...................... | 330/10 |

* cited by examiner

*Primary Examiner*—Patricia Nguyen
(74) *Attorney, Agent, or Firm*—Gifford, Krass, Groh, Sprinkle, Anderson & Citkowski, PC

(57) ABSTRACT

Circuitry and methods increase switching amplifier resolution. Operation of the circuitry broadly relies upon selectively diverting a controlled portion of the output voltage, current, charge, or power from the load, the resolution of which is inversely proportional to the portion diverted. Although modulation of the diverted voltage or current may be effected by pulsewidth variance, analog modulation of voltage or current diversion may alternatively be utilized. Additionally, although current amplifiers are discussed for sake of simplicity, the technique is equally applicable to both voltage and current amplifiers. Multiple instances of the invention may also be scaled at contiguous resolutions to yield greatly improved system resolution. It has been found that accurate production of pulse widths approaching zero is the prime resolution-limiting factor of some switching amplifier topologies. This particular limitation results in very audible crossover distortion. The technique disclosed herein is particularly helpful in this instance, in that its activity opposes the existing amplifier output, balancing the composite output.

9 Claims, 3 Drawing Sheets

SWITCHING AMPLIFIER RESOLUTION ENHANCEMENT APPARATUS AND METHODS

REFERENCE TO RELATED APPLICATION

This application claims priority from U.S. provisional patent application Ser. No. 60/205,724, filed May 19, 2000, the entire contents of which is incorporated herein by reference.

BACKGROUND OF THE INVENTION

Switching amplifiers yield high outputs at high efficiency. In that most effect control through modulation of the duration and/or frequency of output pulses, however, their resolution is typically inversely proportional to bandwidth. This is due to finite switching speed limitations of the circuitry involved. Resultantly, switching amplifiers have earned a reputation of high distortion, and often are relegated to low bandwidth or imprecise applications. Improvement of the resolution of these amplifiers will open many applications for them previously reserved for their less-efficient analog counterparts.

SUMMARY OF THE INVENTION

This invention resides in circuitry and methods of increasing the resolution of a switching amplifier. It has been found that accurate production of pulse widths approaching zero is the prime resolution-limiting factor of some switching amplifier topologies. This particular limitation results in very audible crossover distortion. The technique disclosed herein is particularly helpful in this instance, in that its activity opposes the existing amplifier output, balancing the composite output.

Operation of the inventive circuitry broadly relies upon selectively diverting a controlled portion of the output voltage, current, charge, or power from the load, the resolution of which is inversely proportional to the portion diverted. Although modulation of the diverted voltage or current may be effected by pulsewidth variance, analog modulation of voltage or current diversion may alternatively be utilized.

Although current amplifiers are discussed for sake of simplicity, the technique is equally applicable to both voltage and current amplifiers. Multiple instances of the invention may also be scaled at contiguous resolutions to yield greatly improved system resolution.

DETAILED DESCRIPTION OF THE INVENTION

Figure 1:
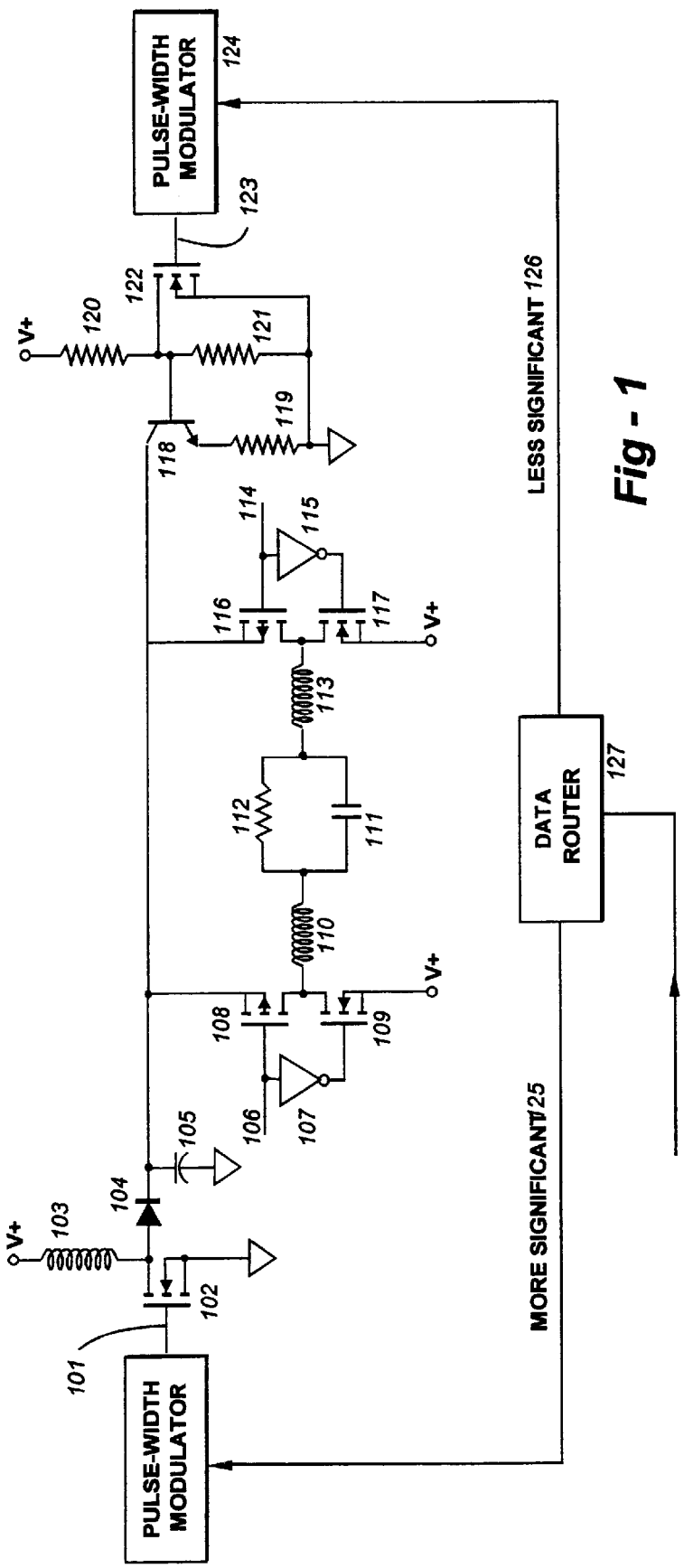
FIG. 1 is a schematic diagram of an inductive boost (current) amplifier incorporating a preferred embodiment of the invention, wherein output current is diverted under pulsewidth modulation.

Referring now to FIG. 1, incoming data 128 is separated into more significant stream 125 and less significant stream 126 by data router 127, which provides input to pulse width modulators 100 and 124, respectively. Inductor 103 is alternately charged by switching device 102, under control of control signal 101 from pulse width modulator 100, and discharged through diode 104 into capacitor 105.

Switching devices 108 and 116 direct the charge of capacitor 105 through either inductor 110 or 113, respectively, to load 112, under the mutually exclusive control signals 106 and 114, respectively. Capacitor 111 acts with inductor 110 and 113 to remove undesired switching components at load 112.

Switching devices 109 and 117, driven by inverters 107 and 115 under control of mutually exclusive control signals 106 and 114, respectively provide current return paths for power ultimately delivered to load 112.

The preceding circuitry is an embodiment of a switching amplifier with impedance transformation output stage shown in U.S. Pat. No. 5,610,553, the content of which is incorporated herein by reference. It is assumed that operation of the preceding circuitry approaches, but does not achieve zero output when presented with a null input.

Continuing with FIG. 1, a constant current source comprised of resistors 119, 120, and 121, in conjunction with transistor 118 is gated by switching device 122, under control of control signal 123 from pulse width modulator 124. The configuration shown is connected such that a logic zero of control signal 123 allows a constant current to be extracted from the charge of capacitor 105. The charge so extracted is therefore subtracted from that ultimately delivered to load 112.

Figure 2:
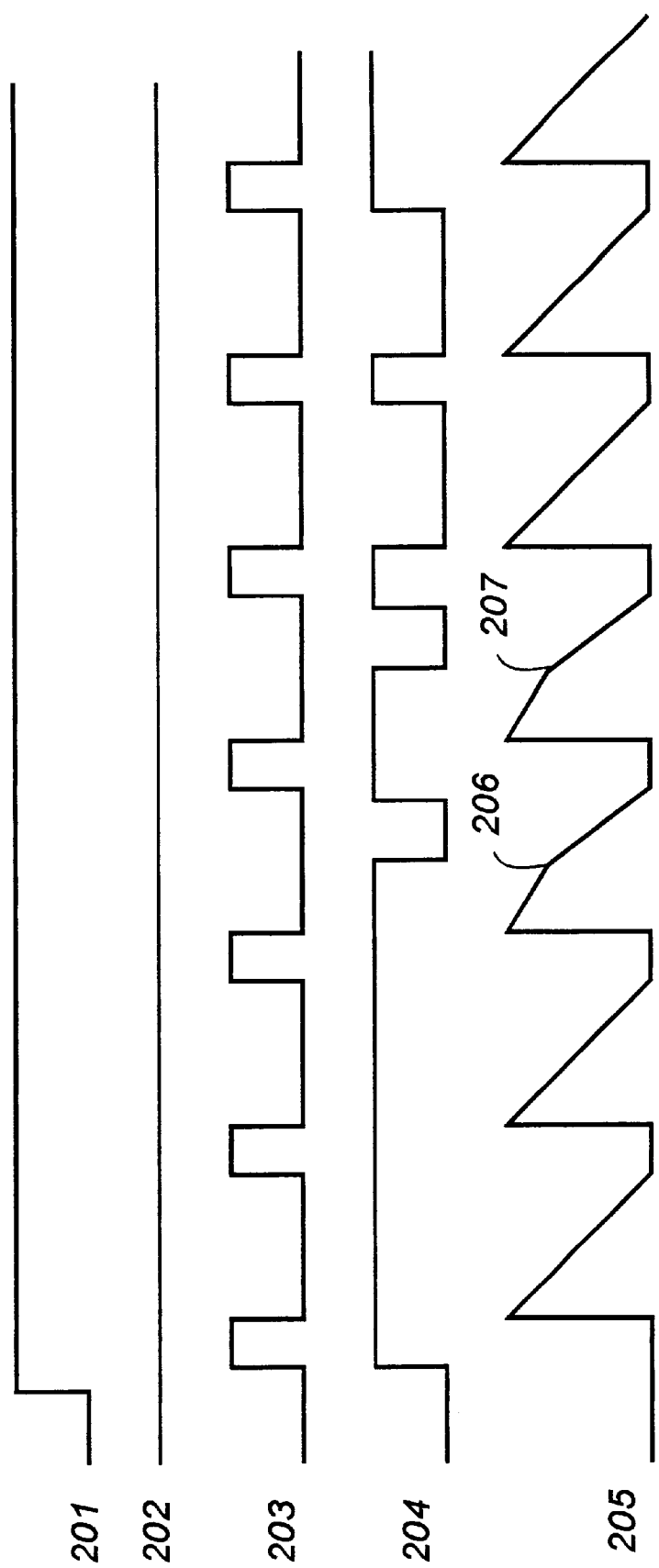
FIG. 2 shows control and output signals of the amplifier of FIG. 1.

Referring now to FIG. 2, waveforms 201 and 202 show control voltages 106 and 114 of FIG. 1, respectively. With control voltage 106 high and control voltage 114 low as shown, charge stored in capacitor 105 is supplied to load 111 through inductor 110 and switching device 108, while current return is through inductor 113 and switching device 117.

Waveform 203 shows activity of control voltage 101 of FIG. 1, from pulse width modulator 100, driven by more significant data stream 125. Waveform 204 shows activity of control voltage 123 of FIG. 1, from pulse width modulator 124, driven by less significant data stream 126. Waveform 205 shows voltage at the junction of diode 104 and capacitor 105 of FIG. 1.

For the first two pulses of waveform 203, operation typical of a switching amplifier with impedance transformation output stage is seen with a sharp increase in waveform 205 at the release of waveform 203, followed by a linear fall to zero. In the third and fourth pulses of waveform 203, however, moderate-duration pulses on waveform 204, indicating charge extraction, produce a slope increase at points 206 and 207. This decreases the voltage integral available to the load. At the fifth and sixth pulses of waveform 203, longer-duration pulses of waveform 204 result in a significant slope increase in waveform 205, indicating a more significant decrease in the voltage integral available to the load. Thus, charge stored in inductor 103 of FIG. 1 is modulated by a switched constant current source.

Figure 3:
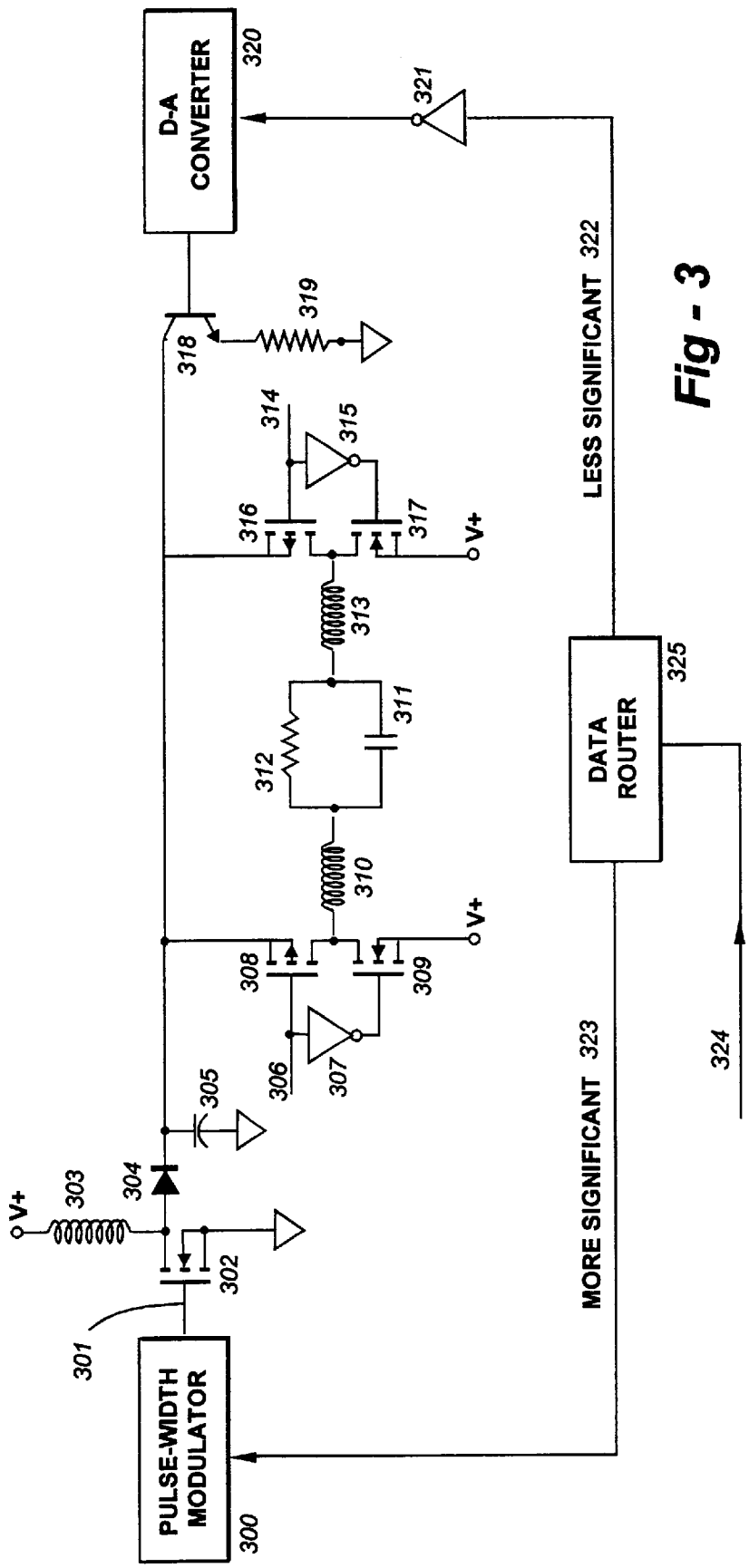
FIG. 3 is a schematic diagram of an inductive boost (current) amplifier incorporating an embodiment of the invention wherein output current is diverted using analog amplitude modulation.

Referring now to FIG. 3, incoming data 324 is separated into more significant stream 323 and less significant stream 322 by data router 325, which provide input to pulse width modulator 300 and digital-to-analog converter 320, through invertors 321, respectively. Inductor 303 is alternately charged by switching device 302, under control of control signal 301 from pulse-width modulator 300, and discharged through diode 304 into capacitor 305.

Switching devices 308 and 316 direct the charge of capacitor 305 through either inductor 310 or 313, respectively, to load 312, under mutually exclusive control signals 306 and 314, respectively. Capacitor 311 acts with inductor 310 and 313 to remove undesired switching components at load 312. Switching devices 309 and 317, driven by inverters 307 and 315 under control of mutually exclusive control signals 306 and 314, respectively provide current return paths for power ultimately delivered to load 312.

The circuitry of FIG. 3 is substantively equivalent to that of FIG. 1, with the exception of digital-to-analog converter 320 and inverter 321. A constant current source comprised of resistor 319 and transistor 318 is modulated by the output of D/A converter 320, under control of less significant data stream 322 as inverted by inverter 321. The configuration shown is thus connected such that increasing values of less significant data stream 322 result in decreasing current to be extracted from the charge of capacitor 305. The charge so extracted is therefore subtracted from that ultimately delivered to load 312.

In that currents sum by parallel connection, multiple instances of the technique disclosed herein may be incorporated at contiguous resolutions, or currents. This will make extremely fine resolution possible with minimal cost. Additionally, although diversion of a current in a current, or charge, amplifier is depicted herein, it is noted that the technique lends itself equally well to diversion of a voltage in a voltage amplifier.

I claim:

1. A method of increasing the resolution of a switching amplifier, comprising the steps of:

selectively diverting a controlled portion of the output voltage, current, charge, or power from the load, the resolution of which is inversely proportional to the portion diverted.

2. The method of claim 1, wherein the diverted portion is modulated.

3. The method of claim 2, wherein the modulation includes pulse-width modulation.

4. The method of claim 2, wherein the modulation includes analog modulation.

5. The method of claim 1, including multiple diversion instances scaled at contiguous resolutions.

6. Apparatus for improving the resolution of a switching amplifier output stage of the type wherein a pulsewidth-modulated input signal is coupled to a load impedance, the circuitry comprising:

a data router operative to divert a portion of the input signal; and circuitry for subtracting the diverted portion from the signal coupled to the load impedance, such that the resolution of the portion diverted is inversely proportional to the magnitude of the portion diverted.

7. The apparatus of claim 6, wherein the circuitry for subtracting the diverted portion from the signal coupled to the load includes a pulse-width modulator.

8. The apparatus of claim 6, wherein the circuitry for subtracting the diverted portion from the signal coupled to the load includes an analog modulator.

9. The apparatus of claim 6, wherein the input signal and diverted portion are representative of voltage, current, charge, or power delivered to the load.

* * * * *

UNITED STATES PATENT AND TRADEMARK OFFICE
CERTIFICATE OF CORRECTION

PATENT NO. : 6,509,793 B2
DATED : January 21, 2003
INVENTOR(S) : Larry Kiru

It is certified that error appears in the above-identified patent and that said Letters Patent is hereby corrected as shown below:

<u>Title page,</u>
Item [76], please delete "Larry Kim" and insert -- Larry Kirn --.

Signed and Sealed this

Twenty-sixth Day of August, 2003

JAMES E. ROGAN
*Director of the United States Patent and Trademark Office*